US008773142B2

(12) United States Patent
Fujii et al.

(10) Patent No.: US 8,773,142 B2
(45) Date of Patent: Jul. 8, 2014

(54) ELECTRONIC PART AND METHOD OF DETECTING FAULTS THEREIN

(75) Inventors: Takeshi Fujii, Osaka (JP); Keisuke Kuroda, Osaka (JP)

(73) Assignee: Panasonic Corporation, Osaka (JP)

( * ) Notice: Subject to any disclaimer, the term of this patent is extended or adjusted under 35 U.S.C. 154(b) by 378 days.

(21) Appl. No.: 13/257,342

(22) PCT Filed: Jun. 23, 2010

(86) PCT No.: PCT/JP2010/004165
§ 371 (c)(1),
(2), (4) Date: Sep. 19, 2011

(87) PCT Pub. No.: WO2010/150532
PCT Pub. Date: Dec. 29, 2010

(65) Prior Publication Data
US 2012/0007641 A1    Jan. 12, 2012

(30) Foreign Application Priority Data

Jun. 26, 2009    (JP) .................................. 2009-151957

(51) Int. Cl.
*G01R 31/28*    (2006.01)
*G01R 31/00*    (2006.01)

(52) U.S. Cl.
CPC ........ *G01R 31/2829* (2013.01); *G01R 31/2882* (2013.01); *G01R 31/007* (2013.01)
USPC ........ 324/537; 324/512; 324/750.3; 327/200; 713/500

(58) Field of Classification Search
CPC ........... G01R 31/2808–31/2818; G01R 31/024
USPC .............. 324/537–544; 327/20; 713/500–601
See application file for complete search history.

(56) References Cited

U.S. PATENT DOCUMENTS 5,761,517 A * 6/1998 Durham et al. ................ 713/322
6,381,705 B1 * 4/2002 Roche .......................... 713/601

(Continued)

FOREIGN PATENT DOCUMENTS

| JP | 05-166889 A | 7/1993 |
| JP | 2000-206201 A | 7/2000 |
| JP | 2006-304490 A | 11/2006 |
| JP | 2008-527340 A | 7/2008 |

OTHER PUBLICATIONS

International Search Report for PCT/JP2010/004165 dated Aug. 24, 2010.

*Primary Examiner* — Melissa Koval
*Assistant Examiner* — Emily Chan
(74) *Attorney, Agent, or Firm* — Pearne & Gordon LLP

(57) ABSTRACT

An electronic component includes an oscillator element, a driving circuit outputting a driving signal to the oscillator element, a clock frequency generator outputting a clock signal to the driving circuit, a clock frequency controller controlling a frequency of the clock signal, a consumption-current detection unit detecting a consumption current of the driving circuit, and a fault detection unit electrically connected to the consumption-current detection unit and the clock frequency controller. When the clock frequency controller changes the frequency of the clock signal, the detected consumption current changes, and allows the consumption-current detection unit to detect the change of the consumption current. The fault detection unit detects a fault based on the change of the frequency of the clock signal and the change of the consumption current. This electronic component can have a fault detection function and a small size.

16 Claims, 8 Drawing Sheets

(56) References Cited

U.S. PATENT DOCUMENTS 7,855,581 B2 * 12/2010 Priel et al. .................. 327/20
8,555,098 B2 * 10/2013 Fujibe et al. .................. 713/323
2008/0297264 A1 * 12/2008 Schwarz et al. .......... 331/116 R

* cited by examiner

ELECTRONIC PART AND METHOD OF DETECTING FAULTS THEREIN

This application is a U.S. National Phase Application of the PCT International Application No. PCT/JP2010/004165.

TECHNICAL FIELD

The present invention relates to an electronic component that is used for electronic devices, such as automobiles, aircrafts, ships, or robots, that have a function to detect a fault, and to a method of detecting a fault of the electronic component.

BACKGROUND ART

FIG. 8 is a circuit diagram of conventional electronic component 501 disclosed in Patent Literature 1. Electronic component 501 includes: oscillator element 1, driving circuit 2 supplying a driving signal to oscillator element 1, a detection signal processor that receives a sense signal from oscillator element 1, and an output circuit that outputs the sense signal output from the detection signal processor. Driving circuit 2 includes: analog-digital (A/D) converter 3 that performs an analog-digital conversion on a monitor signal output from oscillator element 1, automatic gain amplifier 4 that amplifies the monitor signal output from analog-digital converter 3, and digital-analog (D/A) converter 5 that performs a digital-analog conversion on the monitor signal output from automatic gain amplifier 4.

A scan test circuit composed of, e.g. an external pin and a shift resistor is added to electronic component 501 to allow electronic component 501 to have a fault detection function. However, since the scan test circuit includes a lot of flip-flops connected in series, wiring for connecting shift resistors prevents electronic component 501 from having a small size.

CITATION LIST

Patent Literature

PATENT LITERATURE 1: Japanese Patent Laid-Open Publication No. 2008-527340

SUMMARY OF THE INVENTION

An electronic component includes an oscillator element, a driving circuit outputting a driving signal to the oscillator element, a clock frequency generator outputting a clock signal to the driving circuit, a clock frequency controller controlling a frequency of the clock signal, a consumption-current detection unit detecting a consumption current of the driving circuit, and a fault detection unit electrically connected to the consumption-current detection unit and the clock frequency controller. When the clock frequency controller changes the frequency of the clock signal, the detected consumption current changes, and allows the consumption-current detection unit to detect the change of the consumption current. The fault detection unit detects a fault based on the change of the frequency of the clock signal and the change of the consumption current.

This electronic component can have a fault detection function and a small size.

DETAIL DESCRIPTION OF PREFERRED EMBODIMENTS

Figure 1:
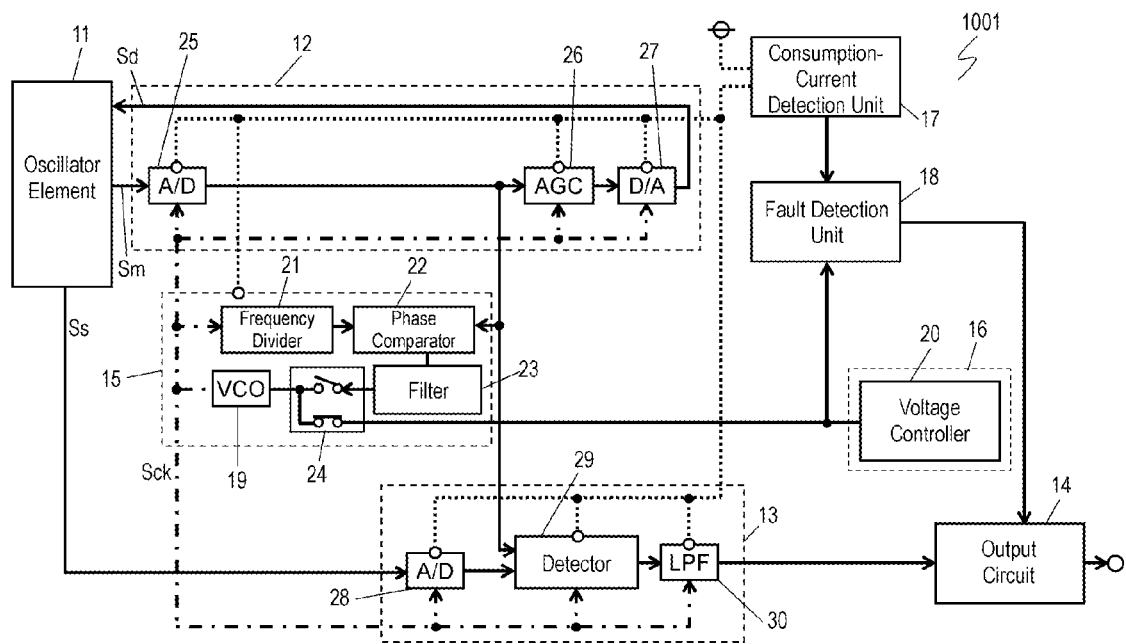
FIG. 1 is a circuit diagram of an electronic component in accordance with an exemplary embodiment of the present invention.

FIG. 1 is a circuit diagram of electronic component 1001 in accordance with an exemplary embodiment of the present invention. Electronic component 1001 includes, oscillator element 11, driving circuit 12 that supplies driving signal Sd to oscillator element 11, detection signal processor 13 that receives sense signal Ss from oscillator element 11, output circuit 14 that outputs the sense signal output from detection signal processor 13, clock frequency generator 15 that outputs clock signal Sck, clock frequency controller 16 that controls the frequency of clock signal Sck, consumption-current detection unit 17 that detects a consumption current of driving circuit 12 and detection signal processor 13, and fault detection unit 18 that is electrically connected to consumption-current detection unit 17 and clock frequency controller 16. Clock frequency generator 15 outputs clock signal Sck to a part of driving circuit 12 and detection signal processor 13. Consumption-current detection unit 17 detects a consumption current of the part of driving circuit 12 and detection signal processor 13 that receives clock signal Sck. Oscillator element 11 oscillates due to the driving signal, and outputs monitor signal Sm that has a frequency and a phase depending on the frequency and the phase of the oscillation, respectively. Monitor signal Sm is supplied to driving circuit 12. Oscillator element 11 outputs sense signal Ss depending on, e.g. an inertia force caused by an acceleration or angular velocity applied to the oscillator element.

Figure 2:
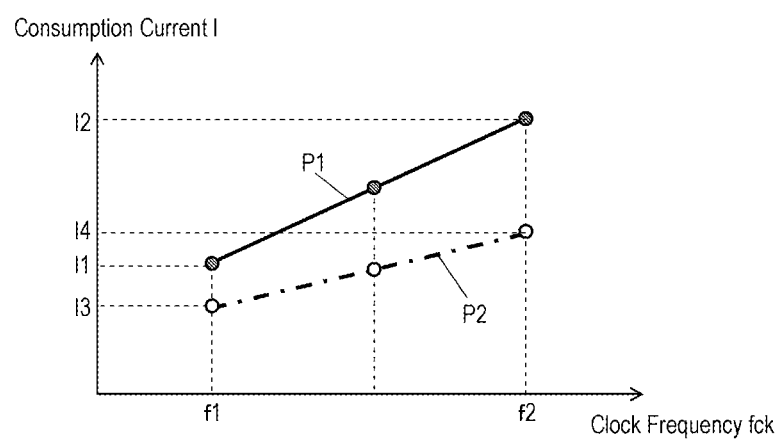
FIG. 2 illustrates a method of detecting a fault of the electronic component in an embodiment.

When clock frequency controller 16 changes the frequency of clock signal Sck, the consumption current detected by consumption-current detection unit 17 changes, that is, the change of the consumption current is detected by consumption-current detection unit 17. Fault detection unit 18 detects a fault of electronic component 1001 based on the relation between the change of the clock signal and the change of the consumption current. FIG. 2 illustrates the relation between frequency fck of clock signal Sck and the consumption current. In general, consumption current I of a digital circuit is expressed as the following formula.

$$I = (1/2) \cdot fck \cdot V \cdot C$$

As shown by the above formula, consumption current I is expressed as the product of clock frequency fck, power-supply voltage V, and input capacitance C. The circuit having therein a fault, such as a disconnection or short-circuit changes the inclination of the change of the clock frequency to the change of the consumption current. As shown in FIG. 2, in the case that the circuit operates normally, the change of frequency fck from frequency f1 to frequency f2 causes consumption current I to change from current I1 to current I2 along profile P1. In the case that the circuit has a fault, the change of frequency fck from frequency f1 to frequency f2 causes consumption current I to change from current I3 to current I4 along profile P2. Thus, the change of frequency fck causes consumption current I to change in a different range depending on the case that the circuit operates normally and the case that the circuit has a fault. This allows fault detection unit 18 to determine whether the circuit has a fault or not by detecting the change of consumption current I corresponding to the change of frequency fck. Specifically, fault detection unit 18 determines that the circuit operates normally when the change of the consumption current I corresponding to the change of frequency fck is within a predetermined range. Fault detection unit 18 determines that the circuit has a fault when the change of consumption current I corresponding to the change of frequency fck is out of the predetermined range.

Figure 8:
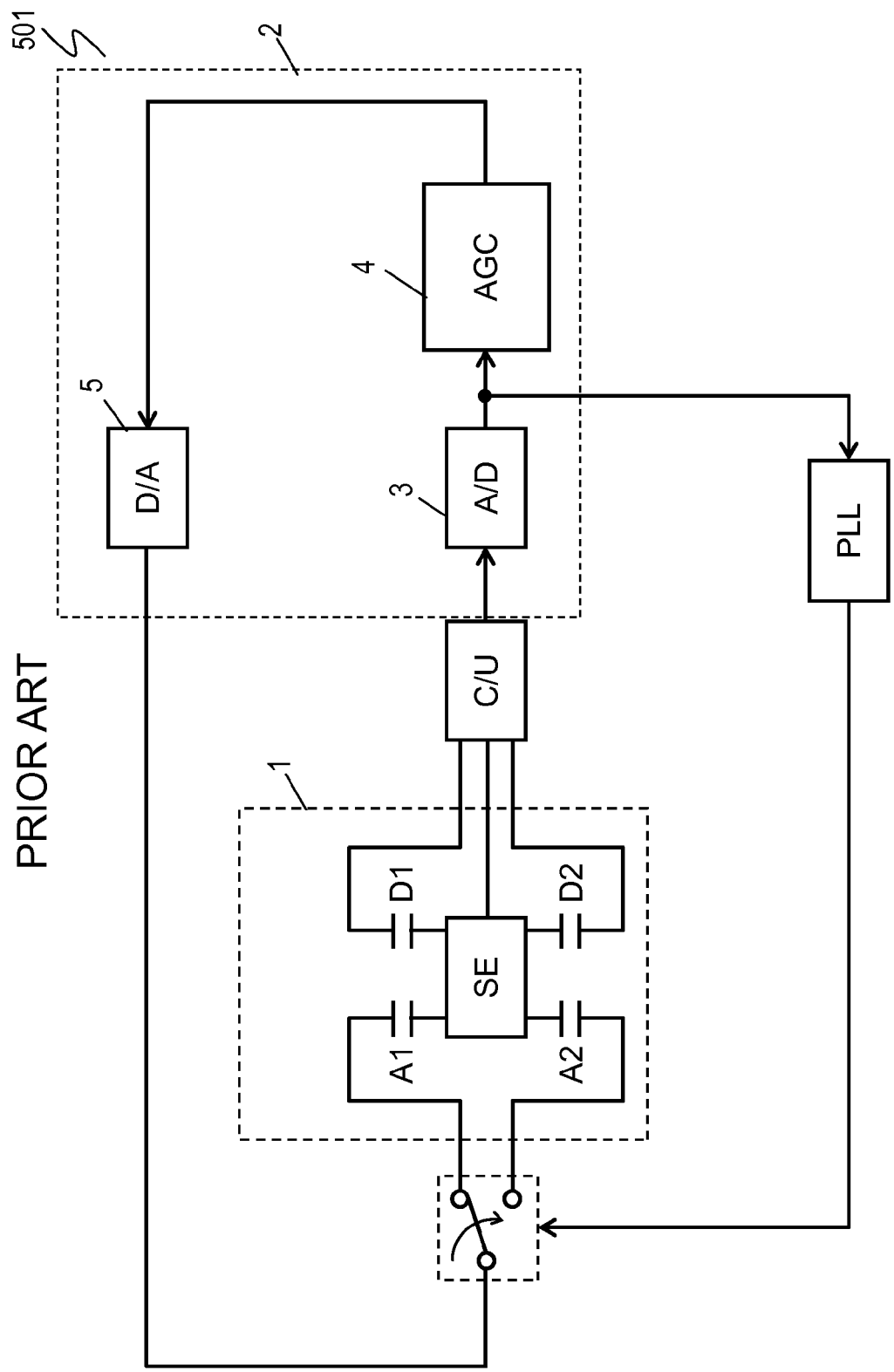
FIG. 8 is a circuit diagram of a conventional electronic component.

This configuration allows electronic component 1001 to have a fault detection function without requiring conventional electronic component 501 shown in FIG. 8 to include a scan test circuit for adding a fault detection function. Thus, electronic component 1001 can have a smaller size.

If the scan test circuit has a large circuit size, test data has a large size, accordingly requiring a long time to detect a fault. Electronic component 1001 according to the embodiment can detect a fault within a short time. This can consequently shorten the time required for a delivery inspection in its manufacturing processes to reduce the cost. This also can shorten the time required for the self-diagnosis after the delivery in electronic component 1001 at starting-up, thus allowing electronic component 1001 to be started up more rapidly.

As shown in FIG. 1, clock frequency generator 15 includes voltage controlled oscillator (VCO) 19. Clock frequency controller 16 includes voltage controller 20. VCO 19 generates a clock signals having a frequency depending on the voltage supplied to VCO 19. Voltage controller 20 controls frequency fck of the clock signal output from clock frequency generator 15 by changing the voltage supplied to voltage controlled oscillator 19.

Clock frequency generator 15 includes frequency divider 21, phase comparator 22, filter 23, and switch 24. Frequency divider 21 frequency-divides frequency fck of clock signal Sck generated by voltage controlled oscillator 19 at a frequency division ratio. Phase comparator 22 outputs current depending on the result of comparing the phase of the signal output from frequency divider 21 to the phase of monitor signal Sm. Filter 23 smoothes the current output from phase comparator 22 to convert the output current to a voltage, and supplies the voltage to VCO 19. Switch 24 selectively supplies, to VCO 19, the voltage output from filter 23 and the voltage output from voltage controller 20.

When the phase or the amplitude of monitor signal Sm in driving circuit 12 reaches a predetermined value, switch 24 supplies, to voltage controlled oscillator 19, the voltage output from filter 23.

Phase comparator 22 compares the frequency of the clock signal frequency-divided by frequency divider 21 to the frequency of the monitor signal in driving circuit 12, thereby adjusting frequency fck of clock signal Sck to a desired frequency. Thus, clock frequency generator 15 can preferably output a clock signal having a stable frequency.

Driving circuit 12 includes analog-digital (A/D) converter 25 that performs an analog-digital conversion on monitor signal Sm output from oscillator element 11, automatic gain amplifier 26 that amplifies the monitor signal output from A/D converter 25, and digital-analog (D/A) converter 27 that performs a digital-analog conversion on the monitor signal output from automatic gain amplifier 26. Clock frequency generator 15 outputs clock signal Sck to at least one of analog-digital converter 25, automatic gain amplifier 26, and D/A converter 27. Clock frequency controller 16 changes frequency fck of clock signal Sck output from clock frequency generator 15. Consumption-current detection unit 17 detects the change in a consumption current of at least one of analog-digital converter 25, automatic gain amplifier 26, and D/A converter 27 corresponding to the change of frequency fck.

Detection signal processor 13 includes A/D converter 28 that performs an analog-digital conversion on sense signal Ss output from oscillator element 11, detector 29 that detects the sense signal output from analog-digital converter 28 based on monitor signal Sm output from oscillator element 11, and filter 30 that smoothes the detected sense signal to convert the sense signal to a direct-current (DC) voltage to output the DC voltage. Clock frequency generator 15 outputs clock signal Sck to at least one of A/D converter 28, detector 29, and filter 30. When a fault is detected, switch 24 supplies, to voltage controlled oscillator 19, not a voltage output from filter 23 but a voltage output from voltage controller 20. Consumption-current detection unit 17 detects the change of the consumption current of at least one of A/D converter 28, detector 29, and filter 30 that corresponds to the change of frequency fck by frequency controller 16. Output circuit 14 outputs the fault detection signal from fault detection unit 18, and further outputs the sense signal from filter 30. Output circuit 14 may output the fault detection signal and the sense signal by time division. In this case, output circuit 14 outputs the fault detection signal when the fault of electronic component 1001 is detected, and output circuit 14 outputs the sense signal when oscillator element 11 outputs sense signal Ss depending on the inertia force.

Figure 3:
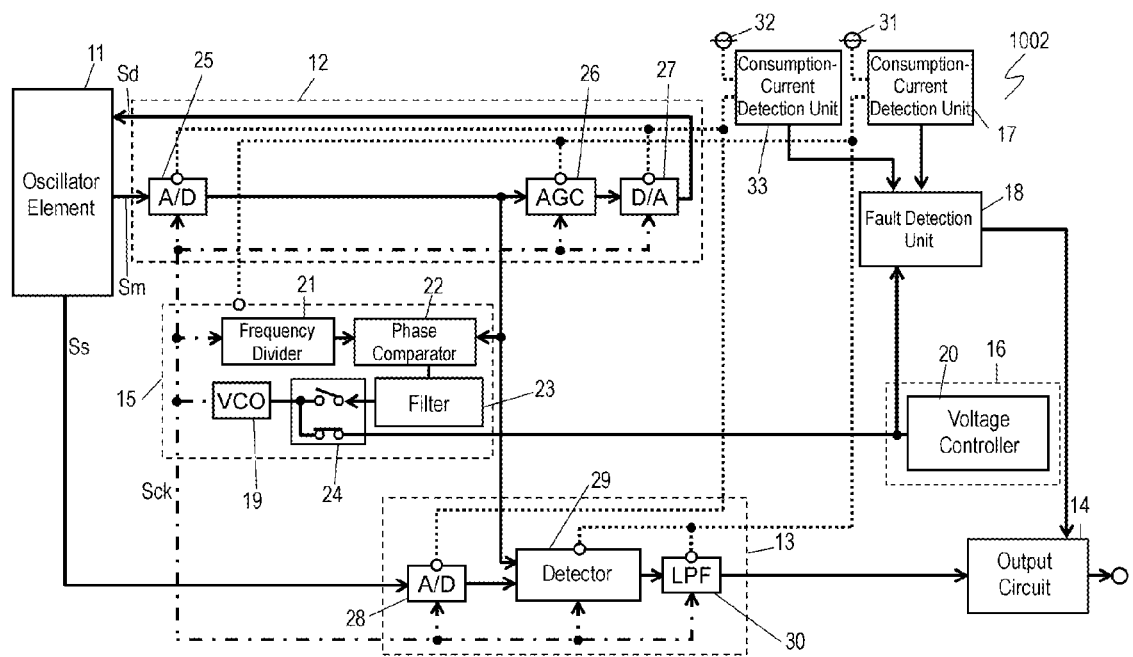
FIG. 3 is a circuit diagram illustrating another electronic component in accordance with the embodiment.

FIG. 3 is a circuit diagram of another electronic component 1002 according to the embodiment. In FIG. 3, components identical to those of electronic component 1001 shown in FIG. 1 are denoted by the same reference numerals. Power source 31 supplies a voltage to consumption-current detection unit 17. Power source 32 supplies a voltage to consumption-current detection unit 33. Consumption-current detection unit 17 detects the consumption current of a circuit, such as automatic gain amplifier 26, detector 29, or filter 30, that processes only a digital signal. Consumption-current detection unit 33 detects the consumption current of a circuit, such as A/D converter 25 or 28 or D/A converter 27, that processes both a digital signal and an analog signal). Power source 31 has a lower voltage than that of power source 32.

This configuration increases the amplitude of the analog signal in the circuit processing the analog signal. Thus, electronic component 1002 can have a large S/N ratio of an analog signal, thus providing a favorable signal quality.

Fault detection unit 18 detects the fault of electronic component 1002 based on the consumption current detected by consumption-current detection unit 17 and the consumption current detected by consumption-current detection unit 33.

Figure 4:
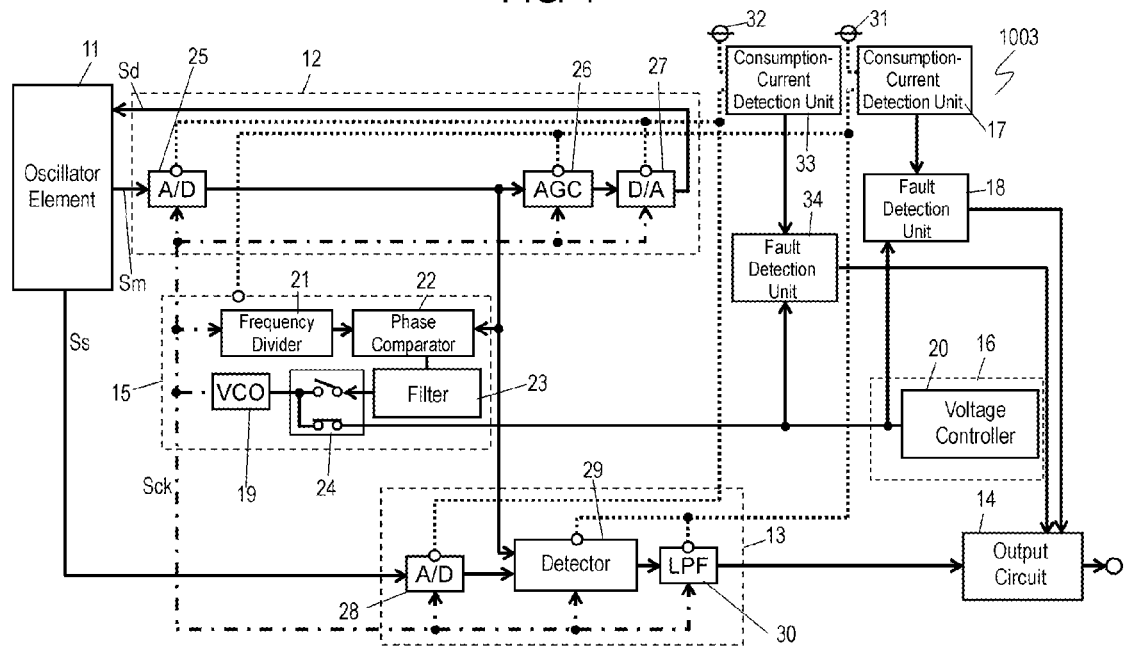
FIG. 4 is a circuit diagram of another electronic component in accordance with the embodiment.

FIG. 4 is a circuit diagram of still another electronic component 1003 according to the embodiment. In FIG. 4, components identical to those parts of electronic component 1002 shown in FIG. 3 are denoted by the same reference numerals. Fault detection unit 18 detects a fault of electronic component 1003 based on the consumption current detected by consumption-current detection unit 17. Fault detection unit 34 detects a fault of electronic component 1003 based on the consumption current detected by consumption-current detection unit 33. This configuration can determine whether the fault exists in the circuit processing only a digital signal or in the circuit processing not only a digital circuit but also an analog signal, thus facilitating to determine a circuit having a fault.

Figure 5:
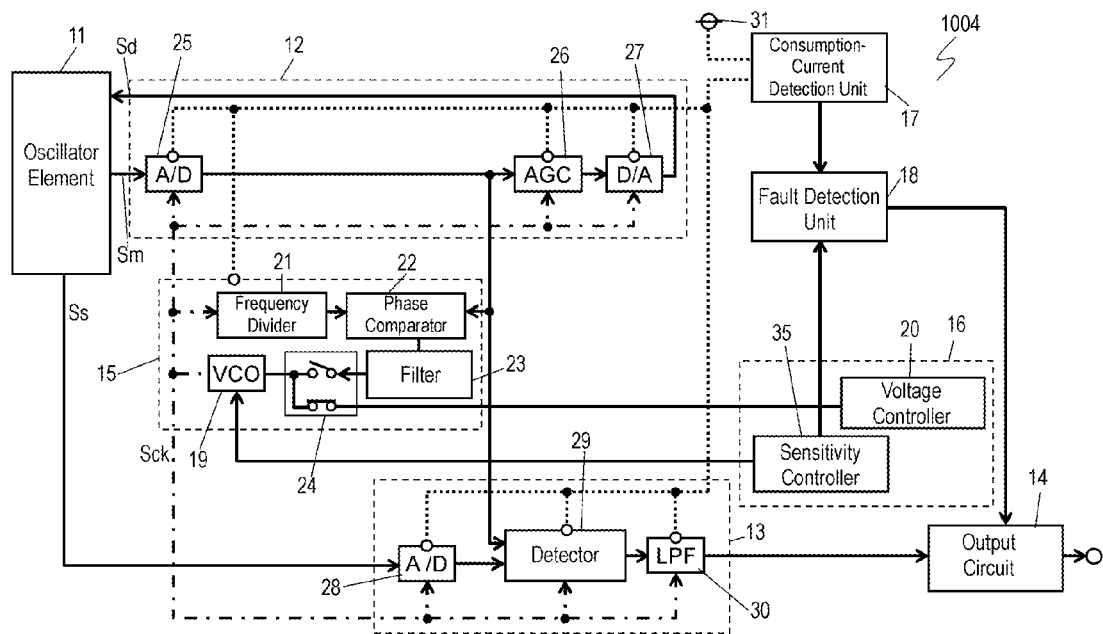
FIG. 5 is an electric circuit diagram of still another electronic component in accordance with the embodiment.
Figure 6:
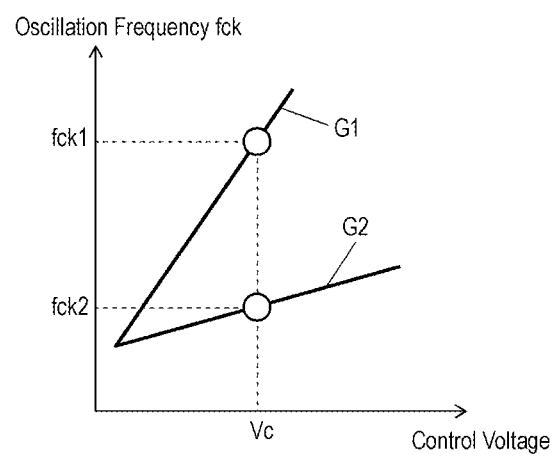
FIG. 6 illustrates a method of adjusting the frequency of a clock signal of the electronic component shown in FIG. 5.

FIG. 5 is a circuit diagram of further electronic component 1004 according to the embodiment. In FIG. 5, components identical to those of electronic component 1001 shown in FIG. 1 are denoted by the same reference numerals. In electronic component 1004, clock frequency controller 16 further includes sensitivity controller 35. Voltage controller 20 changes the voltage supplied to voltage controlled oscillator 19 so as to control frequency fck of clock signal Sck output from clock frequency generator 15. Sensitivity controller 35 controls a sensitivity that is the change of frequency fck to the change of the voltage supplied to voltage controlled oscillator 19. FIG. 6 illustrates the relation between the control voltage supplied to voltage controlled oscillator 19 and oscillation frequency fck of clock signal Sck generated in voltage controlled oscillator 19. Specifically, voltage controller 20 outputs fixed, constant voltage Vc. Sensitivity controller 35 controls voltage controlled oscillator 19 by changing the sensitivity of voltage controlled oscillator 19 from sensitivity G2 to sensitivity G1, accordingly changing frequency fck of clock signal Sck from frequency fck1 to frequency fck2. This configuration does not require the voltage output from voltage controller 20 to be variable, consequently providing the circuit with a smaller size.

Figure 7:
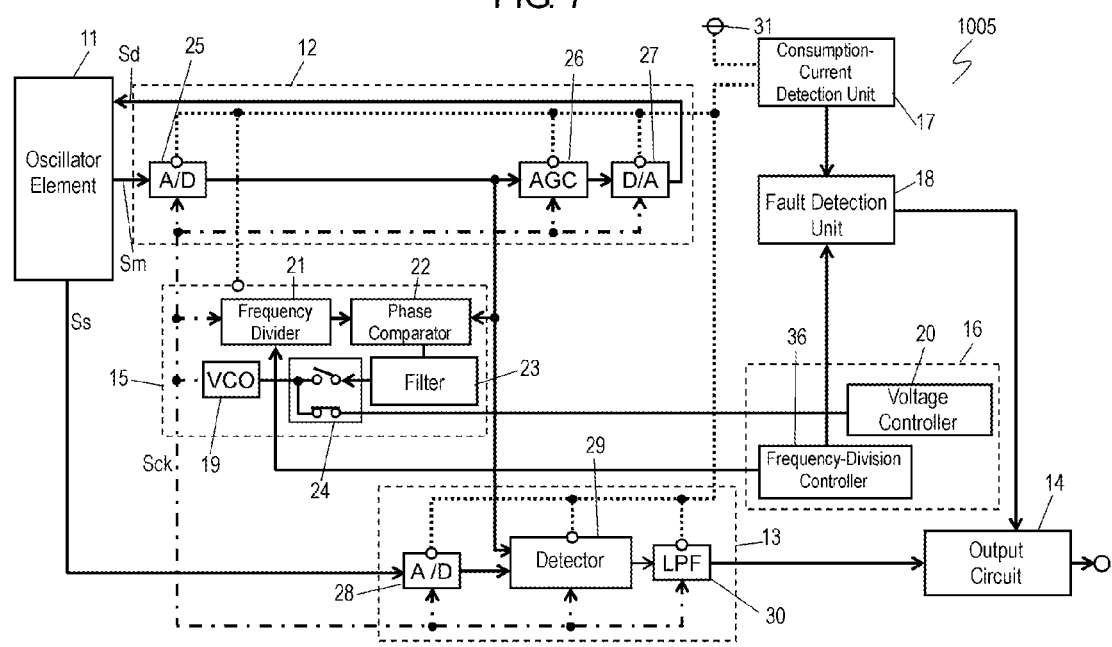
FIG. 7 is a circuit diagram of illustrating a further electronic component in accordance with the embodiment.

FIG. 7 is a circuit diagram of further electronic component 1005 according to the embodiment. In FIG. 7, components identical to those of electronic component 1001 shown in FIG. 1 are denoted by the same reference numerals. In electronic component 1005, clock frequency controller 16 further includes frequency-division controller 36 that changes a he frequency-dividing ratio of frequency divider 21. The frequency-dividing ratio of frequency divider 21 changed by frequency division controller 36 changes the output from phase comparator 22 and the voltage output from filter 23, thereby controlling frequency fck of clock signal Sck. This configuration does not require the voltage output from voltage controller 20 to be variable, hence providing the circuit with a smaller size.

Furthermore, clock frequency generator 15 can output clock signal Sck with stable frequency fck having a small frequency error. This can consequently reduce the detecting error in the consumption current based on the clock frequency, thus improving the fault detection accuracy and suppressing an erroneous decision in the fault detection.

Electronic components 1001 to 1005 including oscillator element 11 according to the embodiment can be applied to a temperature-compensated crystal oscillator (TCXO) using a crystal oscillator element or a Micro Electro Mechanical Systems (MEMS) oscillator using a silicon oscillator element.

INDUSTRIAL APPLICABILITY

An electronic component according to the present invention can have a fault detection function with a small size, thus being useful in various electronic devices, such as automobiles, aircrafts, ships, and robots.

REFERENCE MARKS IN THE DRAWINGS

11 Oscillator Element
12 Driving Circuit
15 Clock Frequency Generator
16 Clock Frequency Controller
17 Consumption-Current Detection Unit (First Consumption-Current Detection Unit)
18 Fault Detection Unit (First Fault Detection Unit)
33 Consumption-Current Detection Unit (Second Consumption-Current Detection Unit)
34 Fault Detection Unit (Second Fault Detection Unit)

The invention claimed is:

1. An electronic component comprising:
an oscillator element;
a driving circuit that outputs a driving signal to the oscillator element;
a detection signal processor that receives a sense signal output from the oscillator element;
a clock frequency generator that outputs a clock signal to the driving circuit;
a clock frequency controller that controls a frequency of the clock signal;
a first consumption-current detection unit that detects a consumption current of at least a part of the driving circuit or at least a part of the detection signal processor; and
a first fault detection unit that is electrically connected to the first consumption-current detection unit and the clock frequency controller,
wherein, when the clock frequency controller changes the frequency of the clock signal, the detected consumption current changes, and allows the first consumption-current detection unit to detect the change of the consumption current, and
wherein the first fault detection unit detects a fault based on the change of the consumption current caused by the change of the frequency of the clock signal.

2. The electronic component according to claim 1,
wherein the clock frequency generator includes a voltage controlled oscillator that generates the clock signal,
wherein the clock frequency controller includes a voltage controller, and
wherein the voltage controller controls the frequency of the clock signal by changing a voltage supplied to the voltage controlled oscillator.

3. The electronic component according to claim 2, wherein the clock frequency generator further includes:
a frequency divider that frequency-divides the clock signal at a frequency dividing ratio,
a phase comparator that outputs an output current changing depending on a comparison result obtained by comparing a frequency of a signal output from the frequency divider with a frequency of the signal in the driving circuit; and
a first filter that supplies, to the voltage controlled oscillator, a voltage obtained by smoothing the output current of the phase comparator.

4. The electronic component according to claim 3, further comprising
a switch that selectively supplies, to the voltage controlled oscillator, the voltage supplied from the first filter and the voltage supplied from the voltage controller,
wherein the switch supplies, to the voltage controlled oscillator, the voltage supplied from the first filter when a phase or an amplitude of the signal in the driving circuit reaches a predetermined value.

5. The electronic component according to claim 1,
wherein the clock frequency generator includes a voltage controlled oscillator,
wherein the clock frequency controller includes a sensitivity controller that controls a sensitivity of the voltage controlled oscillator, and
the sensitivity controller controls the frequency of the clock signal by changing the sensitivity of the voltage controlled oscillator.

6. The electronic component according to claim 1,
wherein the clock frequency generator includes:
- a voltage controlled oscillator;
- a frequency divider that frequency-divides, at a frequency division ratio, a frequency of a clock signal from the voltage controlled oscillator;
- a phase comparator that outputs an output current changing depending on a comparison result obtained by comparing a frequency of a signal output from the frequency divider with a frequency of the signal in the driving circuit; and
- a first filter that supplies, to the voltage controlled oscillator, a voltage obtained by smoothing the output current of the phase comparator.

wherein the clock frequency controller includes a frequency division controller that changes the frequency division ratio, and wherein the frequency division controller controls the frequency of the clock signal output from the clock frequency generator by changing the frequency division ratio.

7. The electronic component according to claim 1,
wherein the driving circuit includes:
- an analog-digital converter that performs an analog-digital conversion on a monitor signal output from the oscillator element;
- an automatic gain amplifier that amplifies the monitor signal output from the analog-digital converter; and
- a digital-analog converter that performs a digital-analog conversion on the monitor signal output from the automatic gain amplifier, wherein the clock frequency generator outputs the clock signal to at least one of the analog-digital converter, the automatic gain amplifier, and the digital-analog converter, wherein, when the clock frequency controller changes the frequency of the clock signal, a consumption current of the at least one of the analog-digital converter, the automatic gain amplifier, and the digital-analog converter changes, and allows the first consumption-current detection unit to detects the change of the consumption current of the at least one of the analog-digital converter, the automatic gain amplifier, and the digital-analog converter.

8. The electronic component according to claim 7, further comprising:
- a first power source that supplies a voltage to the first consumption-current detection unit;
- a second consumption-current detection unit that detects a consumption current of at least one of the analog-digital converter and the digital-analog converter; and
- a second power source that supplies a voltage to the second consumption-current detection unit, wherein the first consumption-current detection unit detects a consumption current of the automatic gain amplifier, wherein the second consumption-current detection unit detects a consumption current of at least one of the analog-digital converter and the digital-analog converter, and wherein the first power source has a voltage lower than a voltage of the second power source.

9. The electronic component according to claim 8, wherein the first fault detection unit detects a fault based on the consumption current detected by the first consumption-current detection unit and the consumption current detected by the second consumption-current detection unit.

10. The electronic component according to claim 8, further comprising
- a second fault detection unit that detects a fault based on the consumption current detected by the second consumption-current detection unit, wherein the first fault detection unit detects a fault based on the consumption current detected by the first consumption-current detection unit, and the second fault detection unit detects a fault based on the consumption current detected by the second consumption-current detection unit.

11. An electronic component comprising:
- an oscillator element;
- a driving circuit that inputs a driving signal to the oscillator element;
- a detection signal processor that receives a sense signal output from the oscillator element;
- a clock frequency generator that outputs a clock signal to at least a part of the detection signal processor;
- a clock frequency controller that controls a frequency of the clock signal;
- a first consumption-current detection unit that detects a consumption current of the part of the detection signal processor;
- a first fault detection unit that is electrically connected to the first consumption-current detection unit and the clock frequency controller; and
- an output circuit that outputs the sense signal output from the detection signal processor, wherein the detection signal processor includes:
- an analog-digital converter that performs an analog-digital conversion on the sense signal output from the oscillator element;
- a detector that detects the sense signal output from the analog-digital converter with using a monitor signal output from the oscillator element, and
- a second filter that smoothes the detected sense signal and outputs a direct-current (DC) voltage, wherein, when the frequency of the clock signal by the clock frequency controller changes, the detected consumption current detected changes, and allows the first consumption-current detection unit to detect the change of the consumption current, and wherein the first fault detection unit detects a fault based on the change of the clock signal and the change of the consumption current.

12. The electronic component according to claim 11, wherein: the clock frequency generator outputs a clock signal to at least one of the analog-digital converter, the detector, and the second filter.

13. The electronic component according to claim 12, further comprising:
- a first power source that supplies a voltage to the first consumption-current detection unit;
- a second consumption-current detection unit that detects a consumption current of the analog-digital converter; and
- a second power source that supplies a voltage to the second consumption-current detection unit, wherein the first consumption-current detection unit detects a consumption current of at least one of the detector and the second filter, and wherein the first power source has a voltage lower than a voltage of the second power source.

14. The electronic component according to claim 13, wherein: the first fault detection unit detects a fault based on the consumption current detected by the first consumption-current detection unit and the consumption current detected by the second consumption-current detection unit.

15. The electronic component according to claim 13, further comprising
a second fault detection unit that detects a fault based on the consumption current detected by the second consumption-current detection unit,
wherein the first fault detection unit detects a fault based on the consumption current detected by the first consumption-current detection unit, and
wherein the second fault detection unit detects a fault based on the consumption current detected by the second consumption-current detection unit.

16. A method of detecting a fault of an electronic component that includes an oscillator element, a driving circuit that supplies a driving signal to the oscillator element, and a detection signal processor that receives a sense signal output from the oscillator element, said method comprising:
outputting a clock signal to the driving circuit;
changing a frequency of the clock signal;
detecting a change of a consumption current of at least a part of the driving circuit or at least a part of the detection signal processor caused by the change of the frequency; and
detecting a fault based on the change of the consumption current caused by the change of the frequency of the clock signal.

* * * * *